United States Patent
Lin et al.

(10) Patent No.: US 11,888,490 B2
(45) Date of Patent: Jan. 30, 2024

(54) DELAY ESTIMATION DEVICE AND DELAY ESTIMATION METHOD

(71) Applicant: Taiwan Semiconductor Manufacturing Company, Ltd., Hsinchu (TW)

(72) Inventors: Yu-Tso Lin, New Taipei (TW); Chin-Ming Fu, Hsinchu County (TW); Mao-Ruei Li, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/169,119

(22) Filed: Feb. 14, 2023

(65) Prior Publication Data

US 2023/0198529 A1 Jun. 22, 2023

Related U.S. Application Data

(63) Continuation of application No. 17/529,282, filed on Nov. 18, 2021, now Pat. No. 11,616,508, which is a continuation of application No. 17/083,304, filed on Oct. 29, 2020, now Pat. No. 11,184,009, which is a continuation of application No. 16/835,254, filed on Mar. 30, 2020, now Pat. No. 10,855,291.

(51) Int. Cl.
*H03L 7/085* (2006.01)
*H03L 7/081* (2006.01)

(52) U.S. Cl.
CPC .......... *H03L 7/085* (2013.01); *H03L 7/0814* (2013.01)

(58) Field of Classification Search
CPC ....... H03L 7/085; H03L 7/0814; H03L 7/091; G01R 31/31725
See application file for complete search history.

(56) References Cited

U.S. PATENT DOCUMENTS

| | | | |
|---|---|---|---|
| 8,664,994 B1 * | 3/2014 | Amrutur | H03H 17/0018 327/284 |
| 2015/0236706 A1 * | 8/2015 | Kim | H03L 7/0814 327/158 |
| 2016/0087638 A1 * | 3/2016 | Chae | H03L 7/07 327/158 |
| 2019/0199361 A1 * | 6/2019 | Sudalaiyandi | H03K 5/131 |

* cited by examiner

*Primary Examiner* — John W Poos
(74) *Attorney, Agent, or Firm* — JCIPRNET (57) ABSTRACT

The disclosure provides a delay estimation device and a delay estimation method. The delay estimation device includes a pulse generator, a digitally controlled delay line (DCDL), a time-to-digital converter (TDC), and a control circuit. The pulse generator receives a reference clock signal, outputs a first clock signal in response to a first rising edge of the reference clock signal, and outputs a second clock signal in response to a second rising edge of the reference clock signal. The DCDL receives the first clock signal from the pulse generator and converts the first clock signal into phase signals based on a combination of delay line codes. The TDC samples the phase signals to generate a timing code based on the second clock signal. The control circuit estimates a specific delay between the first clock signal and the second clock signal based on the timing code.

16 Claims, 6 Drawing Sheets

DELAY ESTIMATION DEVICE AND DELAY ESTIMATION METHOD

CROSS-REFERENCE TO RELATED APPLICATION

This application is a continuation application of and claims the priority benefit of a prior application Ser. No. 17/529,282 filed on Nov. 18, 2021. The prior application Ser. No. 17/529,282 is a continuation application of and claims the priority benefit of a prior application Ser. No. 17/083,304 filed on Oct. 29, 2020, which is a continuation application of and claims the priority benefit of a prior application Ser. No. 16/835,254, filed on Mar. 30, 2020, U.S. Pat. No. 10,855,291B1, issued on Dec. 1, 2020. The entirety of each of the above-mentioned patent applications is hereby incorporated by reference herein and made a part of this specification.

BACKGROUND

Delay locked loop (DLL) normally increases/counts delay from minimum to desired value, which needs a lot of cycles if the desired delay time is large. Some of the conventional DLLs are disposed with a time to digital converter (TDC) for reducing lock time. First and second rising edge measure timing difference if equal to desired delay time, and only few cycles left before lock. In this way, timing information (characterized as a timing code) thus is stored in the D flip-flops (DFFs) of the TDC, but the larger the desired delay is, the more TDC stages are required. Besides, one more delay line circuit same with the delay locked loop is needed for performing timing comparison. As a result, the delay line circuit consumes large layout area and power, especially in high speed application.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not n itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
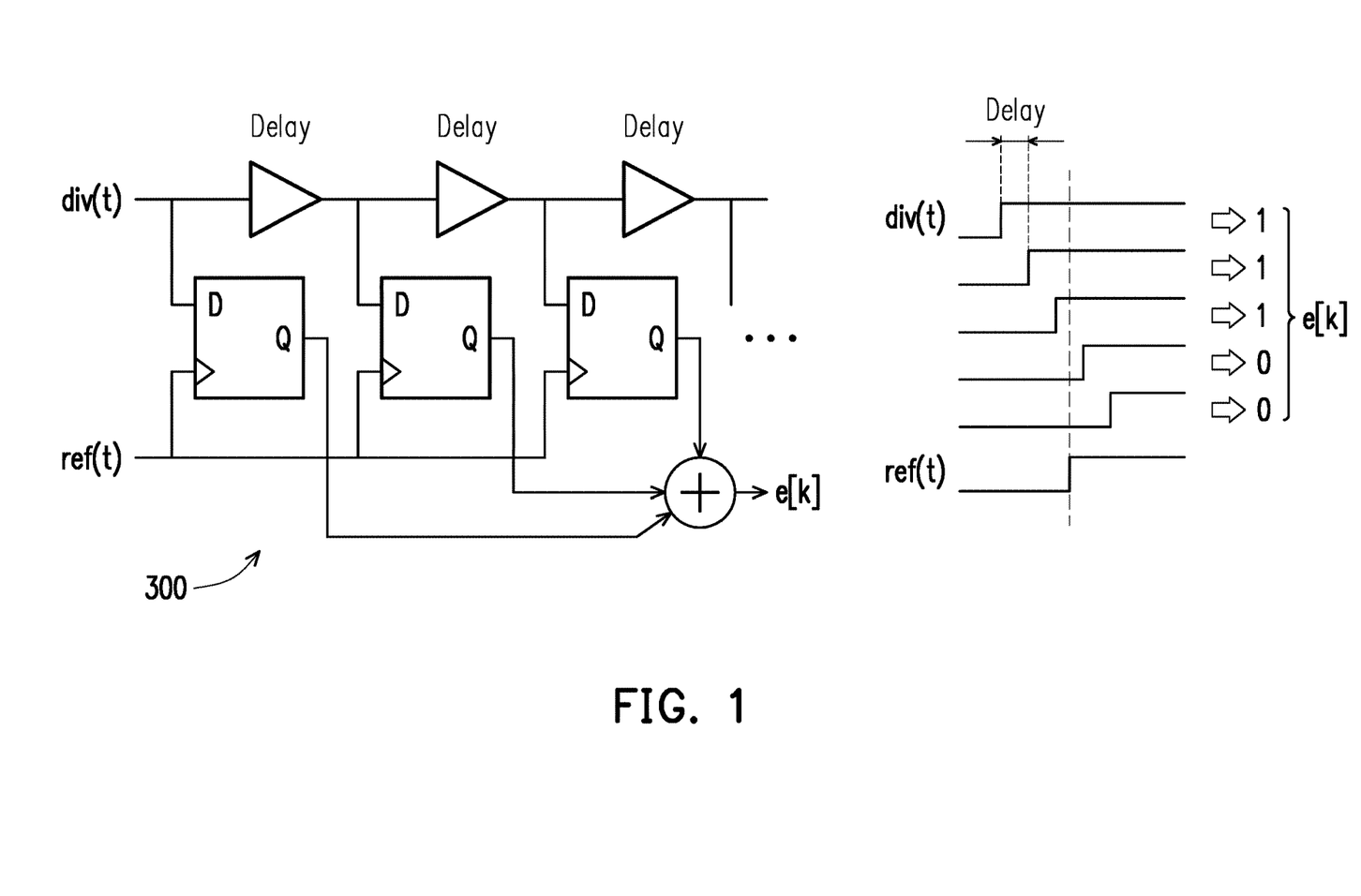
FIG. 1 illustrates a schematic diagram of a TDC and a signal timing diagram thereof.

FIG. 1 illustrates a schematic diagram of a TDC and a signal timing diagram thereof. The TDC 300 may be adopted in many DLL/PLL with multi-bit digital output codes according to different timing difference and minimum time delay (or delay resolution). In FIG. 1, the TDC 300 may include several stages of gate delays and DFFs corresponding thereto. The signals div(t) and ref(t) may be input data signal and sampling clock signal, respectively. As shown in FIG. 1, the input data signal div(t) may be delayed by many delay buffers and thus leads to different timing rising step voltage at each buffer output. The rising edge of ref(t) samples the voltage of each buffer output and generates timing information (characterized as a timing code e[k]) at each DFF output. For example, in FIG. 1, if the TDC 300 has 5 stages, the TDC 100 would generate the timing code "11100" as an output, and the timing relationship (or timing difference) between div(t) and ref(t) may be observed based on the transition from 1 to 0 in the timing code "11100".

Typically, one delay resolution corresponds to one logic gate delay and the time detection range is large if the number of stages in the TDC 300 is large, which also leads to large layout area and high power dissipation. For example, if the TDC 300 include 128 stages of gate delays and each gate delay corresponds to a delay time of 10 ps, the detection range of the TDC 300 may be up to 1280 ps. For another example, if the TDC 300 is designed to detect a 500 MHz (2 ns) input clock signal, the TDC 300 requires 200 stages of gate delays, which needs at least 200 D-type flip-flops. This not only occupies large layout area but also leads to large power dissipation. Furthermore, along with the increasing number of the TDC stages, the linearity of the TDC becomes worse and worse due to practical CMOS process manufacturing.

Therefore, the disclosure has provided a delay estimation device that may achieve large detection range with better linearity, smaller layout area, and lower power consumption.

Figure 2:
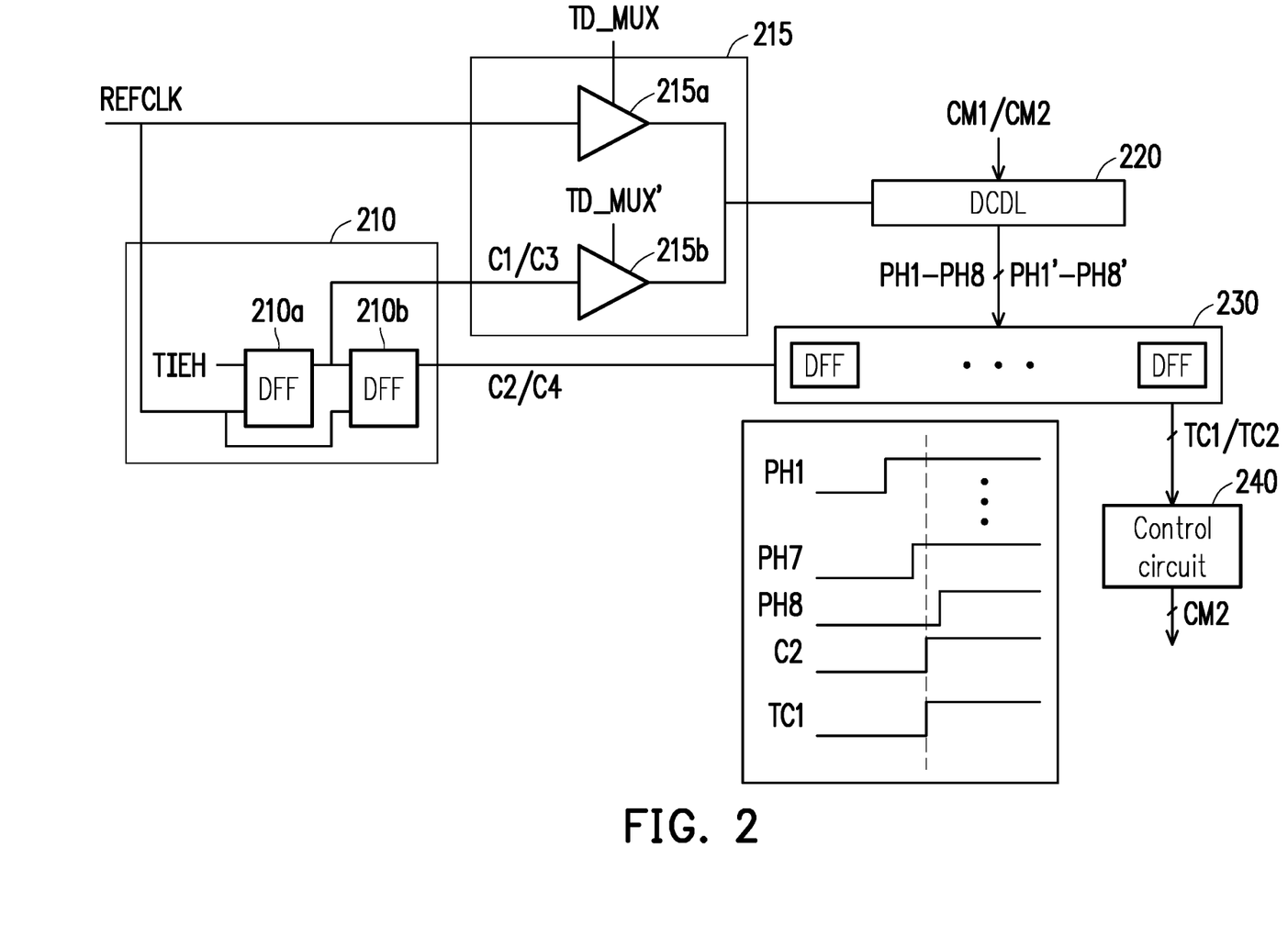
FIG. 2 shows a schematic diagram of a delay estimation device according to an embodiment of the disclosure.

See FIG. 2, which shows a schematic diagram of a delay estimation device according to an embodiment of the disclosure. In FIG. 2, a delay estimation device 200 may be a DLL that includes a pulse generator 210, a digitally controlled delay line (DCDL) 220, a time-to-digital converter (TDC) 230, and a control circuit 240.

The pulse generator 210 receives a reference clock signal REFCLK, outputs a first clock signal C1 in response to a first rising edge of the reference clock signal REFCLK, and outputs a second clock signal C2 in response to a second rising edge of the reference clock signal REFCLK.

Specifically, the pulse generator 210 includes a first DFF 210a and a second DFF 210b. The first DFF 210a has a data input terminal, a clock input terminal, and an output terminal, wherein the clock input terminal of the first DFF 210a receives the first clock signal, the data input terminal of the first DFF 210a receives a predetermined data signal TIEH, wherein the first DFF 210a outputs the first clock signal C1 via the output terminal of the first DFF 210a in response to the first rising edge of the reference clock signal REFCLK and the predetermined data signal TIEH. In one embodiment, the predetermined data signal may be a logic 1 signal. In this case, the first DFF 210a may be regarded as outputting the reference clock signal REFCLK as the first clock signal C1 in response to the first rising edge of the reference clock signal REFCLK, but the disclosure is not limited thereto.

The second DFF 210b has a data input terminal, a clock input terminal, and an output terminal, wherein the clock input terminal of the second DFF 210b receives the reference clock signal REFCLK, the data input terminal of the second DFF 210b is coupled with the output terminal of the first DFF 210a and receives the first clock signal C1, wherein the second DFF 210b outputs the second clock signal C2 via the output terminal of the second DFF 210b in response to the second rising edge of the reference clock signal REFCLK.

The DCDL 220 is coupled with the pulse generator 210. In the embodiments of the disclosure, the DCDL 220 may include a plurality of serially connected delay cells, which may be controlled by a combination of delay line codes, and the technical details of the DCDL 220 may be referred to related prior arts, which would not be repeated herein. For facilitating the following discussions, the DCDL 220 may be assumed to include 8 delay cells for delaying the first clock signal C1 as a plurality of phase signals, but the disclosure is not limited thereto.

In FIG. 2, the DCDL 220 may receive the first clock signal C1 from the pulse generator 210 and convert the first clock signal C1 into a plurality of first phase signals PH1-PH8 based on a first combination CM1 of delay line codes. In the present embodiment, the first combination CM1 of the delay line codes may be a full code, i.e., 8-bit of 1s. In this case, the first clock signal C1 may be maximally delayed to generate the first phase signals PH1-PH8.

From another perspective, the first clock signal C1 may be regarded as the div(t) in FIG. 1, and the first phase signals PH1-PH8 may be regarded as the outputs of each gate delay in FIG. 1, but the disclosure is not limited thereto.

In addition, the delay estimation device 200 may optionally include a mode selecting circuit 215 coupled between the DCDL 220 and the pulse generator 210. In FIG. 2, the mode selecting circuit 215 may include a first buffer 215a and a second buffer 215b. The first buffer 2115a has an input terminal, an output terminal and a control terminal, wherein the input terminal of the first buffer 215a receives the reference clock signal REFCLK, the output terminal of the first buffer 215a is coupled with an input terminal of the DCDL 220, and the control terminal of the first buffer 215a receives a first mode selection signal TD_MUX. The second buffer 215b has an input terminal, an output terminal and a control terminal, wherein the input terminal of the second buffer 215b receives the first clock signal C1 from the pulse generator 210, the output terminal of the second buffer 215b is coupled with the input terminal of the DCDL 220 and the output terminal of the first buffer 215a, and the control terminal of the second buffer 215b receives a second mode selection signal TD_MUX' inverted to the first mode selection signal TD_MUX.

In various embodiments, the mode selecting circuit 215 may selectively output the reference clock signal REFCLK or the first clock signal C1 to the DCDL 220 in response to the first mode selection signal TD_MUX.

In one embodiment, if the first mode selection signal TD_MUX corresponds to a first logic value (e.g., a logic 0), the first buffer 215a of the mode selecting circuit 215a outputs the reference clock signal REFCLK to the DCDL 220. In another embodiment, if the first mode selection signal TD_MUX corresponds to a second logic value (e.g., a logic 1) inverted to the first logic value, the second buffer 215b of the mode selecting circuit 215 outputs the first clock signal C1 to the DCDL 220.

From another perspective, the mode selecting circuit 215 may be used to switch the operation mode of the delay estimation device 200 between a fast lock mode and a normal lock mode. If the first mode selection signal TD_MUX corresponds to the first logic value (e.g., a logic 0), the delay estimation device 200 may be switched to the normal lock mode where the delay estimation device 200 may perform a delay estimation in a regular way. On the other hand, if the first mode selection signal TD_MUX is changed to correspond to the second logic value (e.g., a logic 1), the delay estimation device 200 may be switched to the fast lock mode where the delay estimation device 200 may obtain a specific delay between the first clock signal C1 (which may be the same as the reference clock signal REFCLK in the fast lock mode) and the second clock signal C2 in a more efficient way proposed in the disclosure, and the details thereof would be introduced in the following discussions.

In FIG. 2, the TDC 230 is coupled with the pulse generator 210 and the DCDL 220. Based on the assumption that the DCDL 220 has 8 delay cells, the TDC 230 may be correspondingly disposed with 8 DFFs, but the disclosure is not limited thereto. In one embodiment, the TDC 230 may sample the first phase signals PH1-PH8 to generate a first timing code TC1 based on the second clock signal C2 in a similar way as introduced in FIG. 1.

The control circuit 240 is coupled with the TDC 230, and the control circuit 240 may be implemented as a finite state machine or the like, but the disclosure is not limited thereto.

In a first embodiment where the fast lock mode is selected, the control circuit 240 may directly estimate the specific delay between the first clock signal C1 and the second clock signal C2 based on the first timing code TC1.

Figure 3:
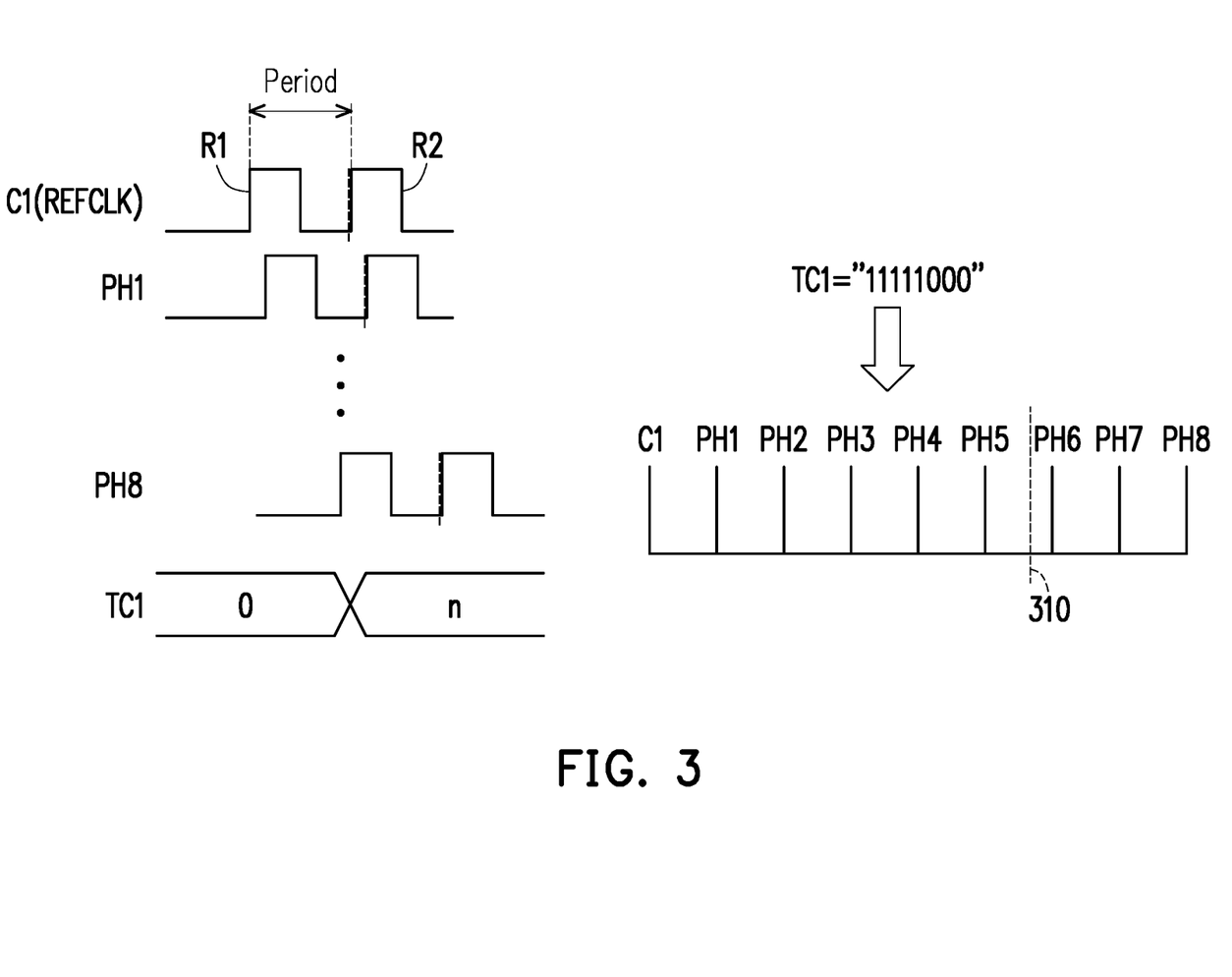
FIG. 3 shows a schematic diagram of the waveforms of the first clock signal and phase signals and a sample result of the TDC according to the first embodiment of the disclosure.

Take FIG. 3 as an example, which shows a schematic diagram of the waveforms of the first clock signal and phase signals and a sample result of the TDC according to the first embodiment of the disclosure. In the present embodiment, it is assumed that the frequency of the first clock signal C1 (i.e., the reference clock signal REFCLK in the fast lock mode) is 500 MHz (i.e., the period between the first rising edge R1 and the second rising edge R2 is 2000 ps), and the maximum delay of the DCDL 200 may be assumed to be 3000 ps. In this case, after the first clock signal C1 is delayed by the DCDL 220 which is configured by the first combination CM1 of the delay line codes (i.e., the full code), the waveforms of the phase signals PH1-PH8 are shown on the left side of FIG. 3. Next, as mentioned in the above embodiments, the TDC 230 may sample the phase signals PH1-PH8 to generate the first timing code TC1.

In general, the first timing code TC1 may include a first number of ones and a second number of zeros, and based on the transition from 1 to 0 in the first timing code TC1, a better choice (which would be referred to as a reference delay time) to start counting to the specific delay may be accordingly derived.

For example, in the present embodiment, the first timing code TC1 may be assumed to be "11111000", which includes 5 (i.e., the first number) of ones and 3 (i.e., the second number) of zeros. In this case, since the transition from 1 to 0 (indicated by the dotted line 310) occurs between the phase signals PH5 and PH6, it represents that a better choice (which would be referred to as a reference delay time) to start counting to the specific delay may be ⅝ of the maximum delay time (e.g., 3000 ps). Therefore, the control circuit 240 may retrieve the reference delay time based on the maximum delay time, the first number, and a sum (e.g., 8) of the first number and the second number.

For example, the control circuit 240 may obtain the reference delay time as 1875 ps by calculate 3000/8×5 (i.e., dividing the maximum delay time by the sum of the first number and the second number and multiplying by the first number). Next, the control circuit 240 may count from the reference delay time (e.g., 1875 ps) until the reference delay time is equal to the specific delay between the first clock signal C1 and the second clock signal C2. In one embodiment, the control circuit 240 may repeatedly update the reference delay time by increasing the reference delay time based on a predetermined increment step (e.g., 1ps) until the updated reference delay time is determined to be equal to the specific delay time between the first clock signal C1 and the second clock signal C2 (i.e., the delay estimation device 200 has "locked"). In various embodiment, the mechanism of determining whether the updated reference delay time is equal to the specific delay may be referred to related prior arts.

As could be understood in the above, under the situation where the DCDL 200 operates based on the full code (which corresponds to the maximum delay time of the DCDL 200), the better choice to start counting to the specific delay may be derived, which may reduce the locking time and hence increase the locking efficiency of the delay estimation device 200.

From another perspective, rather than start counting from a minimum value (e.g., 0) as in conventional ways, the delay estimation device 200 start counting to the specific delay time from the reference delay time which is closer to the specific delay time, and hence the locking efficiency may be improved. Moreover, since the structure of the delay estimation device 200 does not need to be disposed with many TDC stages, the delay estimation device 200 may occupy a smaller layout area and achieves lower power dissipation and higher linearity.

In addition, in a second embodiment where the fast lock mode is selected, the locking efficiency may be further improved. Specifically, in the second embodiment of the disclosure, the delay estimation device 200 may obtain the first timing code TC1 based on the mechanism as introduced in the above. However, instead of directly deriving the reference delay time based on the first timing code TC1 as in the first embodiment, the control circuit 240 in the second embodiment further retrieves a second combination CM2 of the delay line codes based on the first timing code TC1 and uses the second combination CM2 of the delay line codes to control the DCDL 220.

Specifically, in the second embodiment, after retrieving the first timing code TC1, the control circuit 240 may notice that the first combination CM1 of the delay line codes corresponds to ⅝ of the maximum delay time, and the control circuit 240 may accordingly obtain a corrected delay time. In the second embodiment, the corrected delay time may be 6/8 (i.e., (5+1)/8) of the maximum delay time (i.e., 3000/8×6), wherein the "+1" may be regarded as a correction factor and the "6" may be regarded as an updated first number, wherein the correction factor may be designed to be other positive integers according to the requirements of the designer. The control circuit 240 may obtain the second combination CM2 of the delay line codes based on the corrected delay time (i.e., 6/8 of the maximum delay time).

In various embodiments, the control circuit 240 may maintain a look-up table for recording the correspondences between several possibilities of the corrected delay time and several possibilities of the second combination CM2 of the delay line codes. Therefore, once the control circuit 240 obtains the corrected delay time, the control circuit 240 may obtain the corresponding second combination CM2 of the delay line codes by checking the look-up table, but the disclosure is not limited thereto.

After obtaining the second combination CM2, the control circuit 240 may use the second combination CM2 of the delay line codes to control the DCDL 220 for changing the delay mechanism performed by the delay cells in the DCDL 220.

Next, the pulse generator 210 may output a third clock signal C3 in response to a third rising edge of the reference clock signal REFCLK and output a fourth clock signal C4 in response to a fourth rising edge of the reference clock signal REFCLK. The mechanism for the pulse generator 210 (i.e., the first DFF 210a and the second DFF 210b therein) to output the third clock signal C3 and the fourth clock signal C4 is similar to the mechanism of outputting the first clock signal C1 and the second clock signal C2, which may be referred to the discussions in the above embodiments.

Afterwards, the DCDL 220 may receive the third clock signal C3 from the pulse generator 210 and converts the third clock signal C3 into a plurality of second phase signals PH1'-PH8' based on the second combination CM2 of the delay line codes. The mechanism for the DCDL 220 to output the second phase signals PH1'-PH8' is similar to the mechanism of outputting the first phase signals PH1-PH8, which may be referred to the discussions in the above embodiments.

The TDC 230 may sample the second phase signals PH1'-PH8' to generate a second timing code TC2 based on the fourth clock signal C4, and the control circuit 240 may estimates the specific delay between the third clock signal C3 and the fourth clock signal C4 based on the second timing code TC2. The mechanism for the TDC 230 to output the second timing code TC2 is similar to the mechanism of outputting the first timing code TC1, which may be referred to the discussions in the above embodiments.

Similar to the first timing code TC1, the second timing code TC2 may include a third number of ones and a fourth number of zeros, and based on the transition from 1 to 0 in the second timing code TC2, a better choice (i.e., the reference delay time) to start counting to the specific delay may be accordingly derived.

Figure 4:
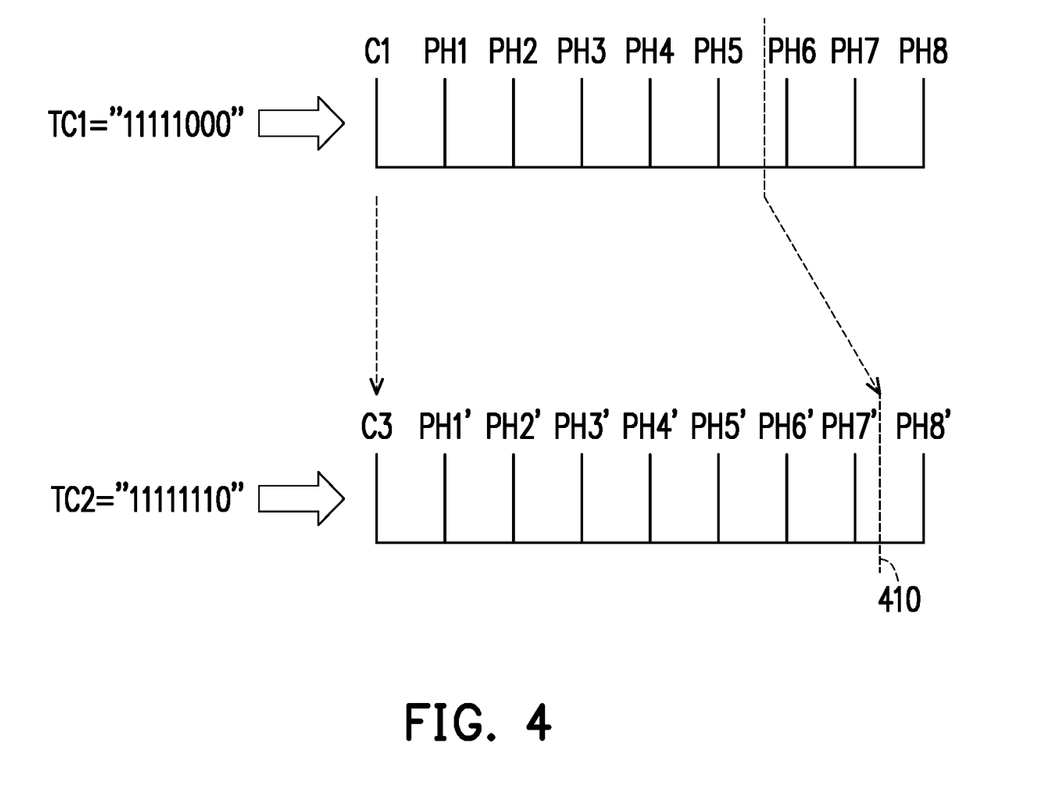
FIG. 4 is a schematic diagram showing a sample result of the TDC according to the second embodiment of the disclosure.

See FIG. 4 for further discussion, wherein FIG. 4 is a schematic diagram showing a sample result of the TDC according to the second embodiment of the disclosure. In FIG. 4, the second timing code TC2 may be assumed to be "11111110", which includes 7 (i.e., the third number) of ones and 1 (i.e., the fourth number) of zeros. In this case, since the transition from 1 to 0 (indicated by the dotted line 410) occurs between the phase signals PH7' and PH8', it represents that the reference delay time to start counting to the specific delay may be ⅞ of the corrected delay time (e.g., ⅝ of the maximum delay time). Therefore, the control circuit 240 may retrieve the reference delay time based on the corrected delay time, the sum of the third number and the fourth number, and the third number.

For example, the control circuit 240 may obtain the reference delay time as 1968 ps by calculate 3000/8×⅝×7 (i.e., dividing the corrected delay time by the sum of the third number and the fourth number and multiplying by the third number). Next, the control circuit 240 may count from the reference delay time (e.g., 1968 ps) until the reference delay time is equal to the specific delay between the third clock signal C3 and the fourth clock signal C4. In one embodiment, the control circuit 240 may repeatedly update the reference delay time by increasing the reference delay time based on a predetermined increment step (e.g., lops) until the updated reference delay time is determined to be equal to the specific delay time between the third clock signal C3 and the fourth clock signal C4 (i.e., the delay estimation device 200 has "locked"). In various embodiment, the mechanism of determining whether the updated reference delay time is equal to the specific delay may be referred to related prior arts.

As could be understood in the above, under the situation where the DCDL 200 operates based on the second combination CM2 corresponding to the corrected delay time, the better choice to start counting to the specific delay may be derived, which may further reduce the locking time and hence increase the locking efficiency of the delay estimation device 200.

Figure 5:
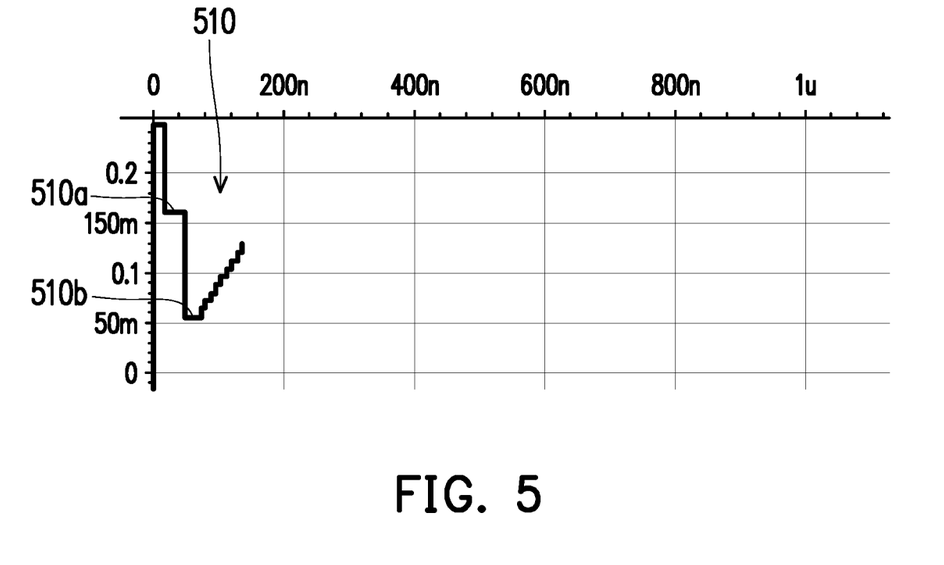
FIG. 5 shows the locking procedure of the second embodiment of the disclosure.

From another perspective, the second embodiment may be regarded as including a two-step procedure, wherein the delay estimation device 200 may obtain the first timing code TC1 in the first step of the two-step procedure, the delay estimation device 200 may obtain the reference delay time in the second step of the two-step procedure, and the locking procedure may be illustrated in FIG. 5.

See FIG. 5, which shows the locking procedure of the second embodiment of the disclosure. In FIG. 5, the waveform 510 corresponds to the second embodiment, wherein the waveform 510 shapes like a stair with two descending steps, which respectively correspond to the aforementioned two steps in the second embodiment. More specifically, the reference numeral 510a corresponds to the timing point where the first timing code TC1 is obtained, and the reference numeral 510b corresponds to the timing point where the reference delay time is obtained. As discussed in the above, once the reference delay time is obtained, the control circuit 240 may start counting from the reference delay time until locking. As could be observed in FIG. 5, the locking procedure is more efficient (i.e., less locking time).

Figure 6:
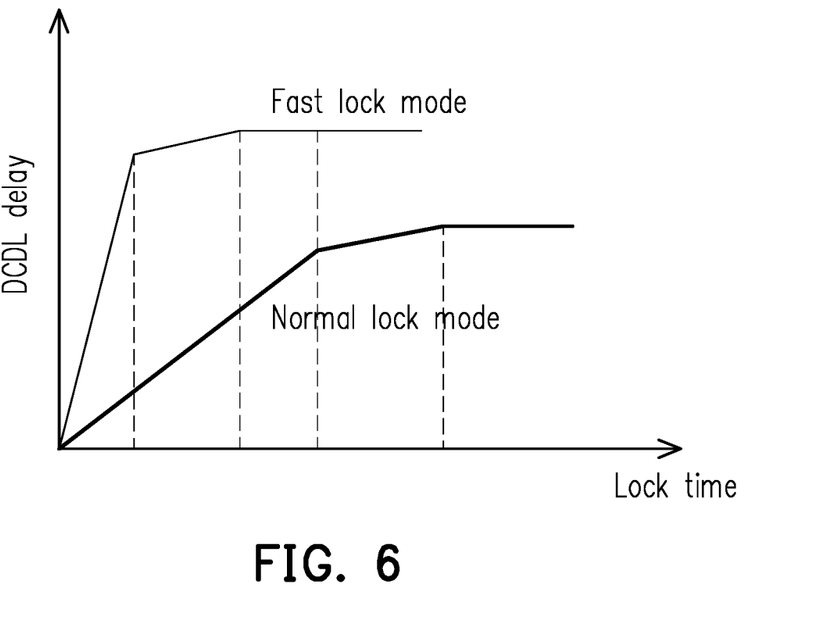
FIG. 6 shows the locking efficiency between the fast lock mode and the normal lock mode.

See FIG. 6, which shows the locking efficiency between the fast lock mode and the normal lock mode. As could be observed in FIG. 6, compared with the normal lock mode where the delay estimation device start counting from the minimum value, the fast lock mode of the delay estimation device has a more efficient locking procedure (i.e., less locking time).

Figure 7:
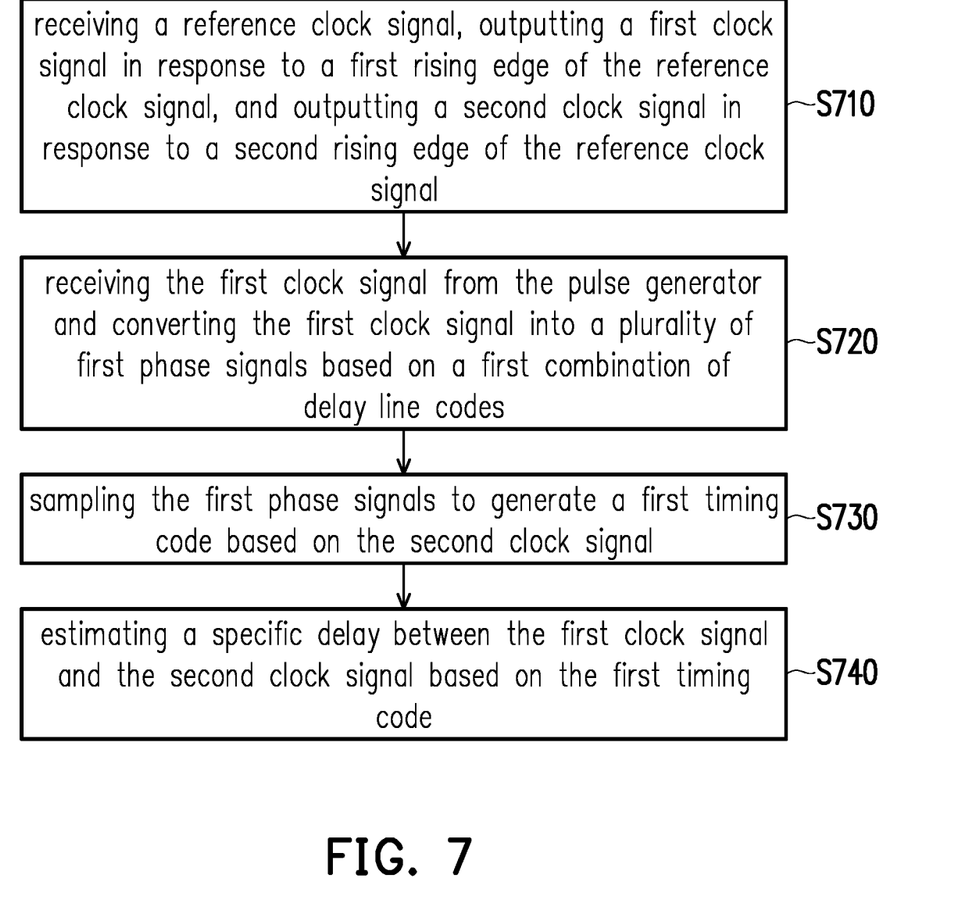
FIG. 7 shows a flow chart of the delay estimation method according to the first embodiment of the disclosure.

See FIG. 7, which shows a flow chart of the delay estimation method according to the first embodiment of the disclosure. The method of FIG. 7 may be executed by the delay estimation device 200 in FIG. 2. In step S710, the pulse generator may receive a reference clock signal REFCLK, output a first clock signal C1 in response to a first rising edge of the reference clock signal REFCLK, and output a second clock signal C2 in response to a second rising edge of the reference clock signal REFCLK. In step S720, the DCDL 220 may receive the first clock signal C1 from the pulse generator 210 and convert the first clock signal C1 into a plurality of first phase signals PH1-PH8 based on a first combination CM1 of delay line codes. In step S730, the TDC 230 may sample the first phase signals PH1-PH8 to generate a first timing code TC1 based on the second clock signal C2. In step S740, the control circuit 240 may estimate a specific delay between the first clock signal C1 and the second clock signal C2 based on the first timing code TC1. Details of the steps S710-S740 may be referred to the above discussions, which would not be repeated herein.

In accordance with some embodiments, the delay estimation device and the delay estimation method proposed in the first embodiment of the disclosure may retrieve a reference delay time that is closer to the specific delay time between the first clock signal and the second clock signal under the situation where the DCDL operates based on the full code, and hence the locking efficiency may outperforms the normal lock mode. In addition, the delay estimation device and the delay estimation method proposed in the second embodiment of the disclosure may retrieve a reference delay time even closer to the specific delay time between the third clock signal and the fourth clock signal with the proposed two-step procedure, and hence the locking efficiency may outperforms the normal lock mode as well. Moreover, since the structure of the proposed delay estimation device does not need to be disposed with many TDC stages, the proposed delay estimation device may occupy a smaller layout area and achieves lower power dissipation and higher linearity.

In accordance with some embodiments, a delay estimation device including a pulse generator, a digitally controlled delay line (DCDL), a time-to-digital converter (TDC), and a control circuit is introduced. The pulse generator receives a reference clock signal, outputs a first clock signal in response to a first rising edge of the reference clock signal, and outputs a second clock signal in response to a second rising edge of the reference clock signal. The DCDL is coupled with the pulse generator, wherein the DCDL receives the first clock signal from the pulse generator and converts the first clock signal into a plurality of first phase signals based on a first combination of delay line codes. The TDC is coupled with the pulse generator and the DCDL and sampling the first phase signals to generate a first timing code based on the second clock signal. The control circuit is coupled with the TDC and estimates a specific delay between the first clock signal and the second clock signal based on the first timing code.

In accordance with some embodiments, a delay estimation device including a pulse generator, a digitally controlled delay line (DCDL), a time-to-digital converter (TDC), and a control circuit is introduced. The pulse generator receives a reference clock signal, outputs a first clock signal in response to a first rising edge of the reference clock signal, and outputs a second clock signal in response to a second rising edge of the reference clock signal. The DCDL is coupled with the pulse generator, wherein the DCDL receives the first clock signal from the pulse generator and converts the first clock signal into a plurality of first phase signals based on a first combination of delay line codes. The TDC is coupled with the pulse generator and the DCDL and samples the first phase signals to generate a first timing code based on the second clock signal. The control circuit is coupled with the TDC, retrieving a second combination of the delay line codes based on the first timing code and using the second combination of the delay line codes to control the DCDL. The pulse generator outputs a third clock signal in response to a third rising edge of the reference clock signal, and outputs a fourth clock signal in response to a fourth rising edge of the reference clock signal. The DCDL receives the third clock signal from the pulse generator and converts the third clock signal into a plurality of second phase signals based on the second combination of delay line codes. The TDC samples the second phase signals to generate a second timing code based on the fourth clock signal. The control circuit estimates a specific delay between the third clock signal and the fourth clock signal based on the second timing code.

In accordance with some embodiments, a delay estimation method adapted for a delay estimation device including a pulse generator, a digitally controlled delay line (DCDL), a time-to-digital converter (TDC), and a control circuit is introduced. The method includes: receiving a reference clock signal, outputting a first clock signal in response to a first rising edge of the reference clock signal, and outputting a second clock signal in response to a second rising edge of the reference clock signal by the pulse generator; receiving the first clock signal from the pulse generator and converting the first clock signal into a plurality of first phase signals based on a first combination of delay line codes by the DCDL; sampling, by the TDC, the first phase signals to generate a first timing code based on the second clock signal; and estimating, by the control circuit, a specific delay between the first clock signal and the second clock signal based on the first timing code.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A delay estimation device, comprising:
   a digitally controlled delay line (DCDL), receiving a first clock signal and generates a plurality of first phase signals based on the first clock signal;
   a time-to-digital converter (TDC), coupled with the DCDL and generating a first timing code based on the first phase signals and a second clock signal; and
   a control circuit, coupled with the TDC, estimating a specific delay between the first clock signal and the second clock signal based on the first timing code;
   a pulse generator for receiving a reference clock signal and outputting the first clock signal and the second clock signal in response to the reference clock signal, wherein the pulse generator comprises:
      a first D flip-flop (DFF), having a data input terminal, a clock input terminal, and an output terminal, wherein the clock input terminal of the first DFF receives the first clock signal, the data input terminal of the first DFF receives a predetermined data signal, wherein the first DFF outputs the first clock signal via the output terminal of the first DFF in response to a first rising edge of the reference clock signal and the predetermined data signal; and
      a second DFF, having a data input terminal, a clock input terminal, and an output terminal, wherein the clock input terminal of the second DFF receives the reference clock signal, the data input terminal of the second DFF is coupled with the output terminal of the first DFF and receives the first clock signal, wherein the second DFF outputs the second clock signal via the output terminal of the second DFF in response to a second rising edge of the reference clock signal; and
   a mode selecting circuit coupled between the DCDL and the pulse generator and selectively outputting the reference clock signal or the first clock signal to the DCDL in response to a first mode selection signal.

2. The delay estimation device according to claim 1, wherein in response to determining that the first mode selection signal corresponds to a first logic value, the mode selecting circuit outputs the reference clock signal to the DCDL, and in response to determining that the first mode selection signal corresponds to a second logic value inverted to the first logic value, the mode selecting circuit outputs the first clock signal to the DCDL.

3. The delay estimation device according to claim 1, wherein the mode selecting circuit comprises:
   a first buffer, having an input terminal, an output terminal and a control terminal, wherein the input terminal of the first buffer receives the reference clock signal, the output terminal of the first buffer is coupled with an input terminal of the DCDL, and the control terminal of the first buffer receives the first mode selection signal; and
   a second buffer, having an input terminal, an output terminal and a control terminal, wherein the input terminal of the second buffer receives the first clock signal from the pulse generator, the output terminal of the second buffer is coupled with the input terminal of the DCDL and the output terminal of the first buffer, and the control terminal of the second buffer receives a second mode selection signal inverted to the first mode selection signal.

4. The delay estimation device according to claim 3, wherein when the first mode selection signal corresponds to a first logic value, the first buffer and the second buffer are turned off and on, respectively, and the second buffer outputs the first clock signal to the DCDL;
   wherein when the first mode selection signal corresponds to a second logic value inverted to the first logic value, the first buffer and the second buffer are turned on and off, respectively, and the first buffer outputs the reference clock signal to the DCDL.

5. The delay estimation device according to claim 1, wherein the first clock signal is converted into the first phase signals based on a first combination of delay line codes, and the first combination of the delay line codes is a full code.

6. The delay estimation device according to claim 1, wherein the control circuit retrieves a reference delay time based on the first timing code and counting from the reference delay time until the reference delay time is equal to the specific delay between the first clock signal and the second clock signal.

7. The delay estimation device according to claim 6, wherein the DCDL has a maximum delay time, the first timing code has a first number of ones and a second number of zeros, and the control circuit retrieves the reference delay time based on the maximum delay time, the first number, and a sum of the first number and the second number.

8. A delay estimation device, comprising:
a digitally controlled delay line (DCDL), receiving a first clock signal and generating a plurality of first phase signals based on the first clock signal;
a time-to-digital converter (TDC), coupled with the DCDL and generating a first timing code based on the first phase signal and a second clock signal;
a control circuit, coupled with the TDC, controlling the DCDL based on the first timing code;
wherein the DCDL receives a third clock signal and generates a plurality of second phase signals based on the third clock signal;
wherein the TDC generates a second timing code based on the second phase signal and a fourth clock signal;
wherein the control circuit estimates a specific delay between the third clock signal and the fourth clock signal based on the second timing code;
wherein the delay estimation device further comprises:
a pulse generator for receiving a reference clock signal and outputting the first clock signal and the second clock signal in response to the reference clock signal, wherein the pulse generator comprises:
a first D flip-flop (DFF), having a data input terminal, a clock input terminal, and an output terminal, wherein the clock input terminal of the first DFF receives the first clock signal, the data input terminal of the first DFF receives a predetermined data signal, wherein the first DFF outputs the first clock signal via the output terminal of the first DFF in response to a first rising edge in the first cycle of the first clock signal and the predetermined data signal, and the first DFF outputs the third clock signal via the output terminal of the first DFF in response to a third rising edge in the second cycle of the reference clock signal and the predetermined data signal; and
a second DFF, having a data input terminal, a clock input terminal, and an output terminal, wherein the clock input terminal of the second DFF receives the reference clock signal, the data input terminal of the second DFF is coupled with the output terminal of the first DFF and receives the first clock signal, wherein the second DFF outputs the second clock signal via the output terminal of the second DFF in response to a second rising edge in the first cycle of the reference clock signal, and the second DFF outputs the fourth clock signal via the output terminal of the second DFF in response to a fourth rising edge in the second cycle of the reference clock signal;
a mode selecting circuit coupled between the DCDL and the pulse generator, selectively outputting the reference clock signal or one of the first clock signal and the third clock signal to the DCDL in response to a first mode selection signal.

9. The delay estimation device according to claim 8, wherein in response to determining that the first mode selection signal corresponds to a first logic value, the mode selecting circuit outputs the reference clock signal to the DCDL, and in response to determining that the first mode selection signal corresponds to a second logic value inverted to the first logic value, the mode selecting circuit outputs the one of the first clock signal and the third clock signal to the DCDL.

10. The delay estimation device according to claim 8, wherein the mode selecting circuit comprises:

a first buffer, having an input terminal, an output terminal and a control terminal, wherein the input terminal of the first buffer receives the reference clock signal, the output terminal of the first buffer is coupled with an input terminal of the DCDL, and the control terminal of the first buffer receives the first mode selection signal; and
a second buffer, having an input terminal, an output terminal and a control terminal, wherein the input terminal of the second buffer receives the one of the first clock signal and the third clock signal from the pulse generator, the output terminal of the second buffer is coupled with the input terminal of the DCDL and the output terminal of the first buffer, and the control terminal of the second buffer receives a second mode selection signal inverted to the first mode selection signal.

11. The delay estimation device according to claim 10, wherein when the first mode selection signal corresponds to a first logic value, the first buffer and the second buffer are turned off and on, respectively, and the second buffer outputs the one of the first clock signal and the third clock signal to the DCDL;
wherein when the first mode selection signal corresponds to a second logic value inverted to the first logic value, the first buffer and the second buffer are turned on and off, respectively, and the first buffer outputs the reference clock signal to the DCDL.

12. The delay estimation device according to claim 8, wherein the first clock signal is converted into the first phase signals based on a first combination of delay line codes, the first combination of the delay line codes is a full code, the control circuit retrieves a second combination of the delay line codes based on the first timing code, and the control circuit uses the second combination of delay line codes to convert the third clock signal into the second phase signals.

13. The delay estimation device according to claim 8, wherein the control circuit retrieves a reference delay time based on the second timing code and counting from the reference delay time until the reference delay time is equal to the specific delay between the third clock signal and the fourth clock signal.

14. The delay estimation device according to claim 13, wherein the DCDL has a maximum delay time, the first timing code has a first number of ones and a second number of zeros, the second timing code has a third number of ones and a fourth number of zeros, and the control circuit obtains a corrected delay time based on the maximum delay time, the first number, a sum of the first number and the second number, and a correction factor and retrieves the reference delay time based on the corrected delay time, a sum of the third number and the fourth number, and the third number.

15. The delay estimation device according to claim 14, wherein the control circuit adds the correction factor to the first number to update the first number and obtains the corrected delay time based on the maximum delay time, the updated first number, and the sum of the first number and the second number.

16. A delay estimation method, adapted for a delay estimation device comprising a pulse generator, a mode selecting circuit, a digitally controlled delay line (DCDL), a time-to-digital converter (TDC), and a control circuit, wherein the method comprises:
selectively outputting, by the mode selecting circuit, a reference clock signal or a first clock signal to the DCDL in response to a first mode selection signal;

receiving, by the pulse generator, the reference clock signal and outputting the first clock signal and a second clock signal in response to the reference clock signal;

receiving the first clock signal from the pulse generator and generating a plurality of first phase signals based on the first clock signal by the DCDL;

generating, by the TDC, a first timing code based on the first phase signal and a second clock signal; and estimating, by the control circuit, a specific delay between the first clock signal and the second clock signal based on the first timing code.

* * * * *